US006695957B1

(12) United States Patent
Stockbower et al.

(10) Patent No.: US 6,695,957 B1
(45) Date of Patent: Feb. 24, 2004

(54) SIMULTANEOUS ELECTRICAL AND FLUID CONNECTION FOR ANODE

(75) Inventors: David W. Stockbower, Burlington, MA (US); Peter V. Kimball, Dennis, MA (US); Iraj Gashgaee, Waltham, MA (US); Geoffrey W. Kaiser, Groton, MA (US)

(73) Assignee: Mykrolis Corporation, Bedford, MA (US)

( * ) Notice: Subject to any disclaimer, the term of this patent is extended or adjusted under 35 U.S.C. 154(b) by 87 days.

(21) Appl. No.: 10/009,310

(22) PCT Filed: May 31, 2000

(86) PCT No.: PCT/US00/14975

§ 371 (c)(1),
(2), (4) Date: Feb. 19, 2002

(87) PCT Pub. No.: WO00/75401

PCT Pub. Date: Dec. 14, 2000

Related U.S. Application Data

(60) Provisional application No. 60/137,561, filed on Jun. 4, 1999.

(51) Int. Cl.[7] ................................................ B23H 11/00
(52) U.S. Cl. .................. 204/275.1; 204/263; 204/279; 204/292
(58) Field of Search ............................ 204/279, 243.1, 204/242, 252, 275.1, 292, 263

(56) References Cited

U.S. PATENT DOCUMENTS

| | | | |
|---|---|---|---|
| 3,836,438 A | | 9/1974 | Sartre et al. ................ 204/279 |
| 3,838,384 A | * | 9/1974 | Jacobs .................... 204/243 R |
| 3,891,531 A | | 6/1975 | Bouy et al. ................ 204/263 |
| 4,045,323 A | | 8/1977 | Boggs, Jr. ................. 204/266 |

* cited by examiner

*Primary Examiner*—Donald R. Valentine
(74) *Attorney, Agent, or Firm*—Nields & Lemack

(57) ABSTRACT

A plating cell base design that utilizes a single connection that provides both fluid communication and electrical communication to the cell. The design eliminates many of the components previously necessary to effectuate fluid and electrical seals. With fewer connections, material cost is reduced, reliability is enhanced, and downtime is reduced.

5 Claims, 4 Drawing Sheets

SIMULTANEOUS ELECTRICAL AND FLUID CONNECTION FOR ANODE

This application claims the benefit of U.S. Provisional application No. 60/137,561 filed Jun. 4, 1999.

BACKGROUND OF THE INVENTION

In semiconductor manufacturing, a plating tool uses a negatively charged anode (usually a copper anode) to plate a positively charged (cathode) silicon wafer. The anode provides a source of replenishing metal ions. At the cathode, the metal ions are reduced to metal and deposited on the cathode surface. Sulfuric acid and a plating solution flows through a chamber around the anode and is used to dissolve a metal (copper) plate. As fluid (plating solution) flows past the anode, it becomes enriched with metal ions. The plating cell generally includes an anode (copper) held in anode holder, and a diffuser assembly.

Conventionally, numerous fluid and electrical connections are required for the plating tool. Such connections generally utilize O-rings, washers and fitting nuts to ensure a sealed connection. Some of these parts require complex machining. The fittings must be electrically conductive and compatible with the plating solution. Titanium is commonly used, as it meets these criteria. As a result, the fittings are a large percentage of the cost of the device.

The anode is replaced often, requiring removal of the plating cell from the tool, and significant disassembly. Simplified and reduced numbers of fluid and electrical connections would simplify this process.

It is therefore an object of the present invention to provide improved fluid and electrical connectology for a plating tool.

SUMMARY OF THE INVENTION

The problems of the prior art have been overcome by the present invention, which provides a plating cell base design that utilizes a single connection that provides both fluid communication and electrical communication to the cell. The design eliminates many of the components previously necessary to effectuate fluid and electrical seals. With fewer connections, material cost is reduced, reliability is enhanced, and downtime is reduced.

DETAILED DESCRIPTION OF THE INVENTION

Figure 1:
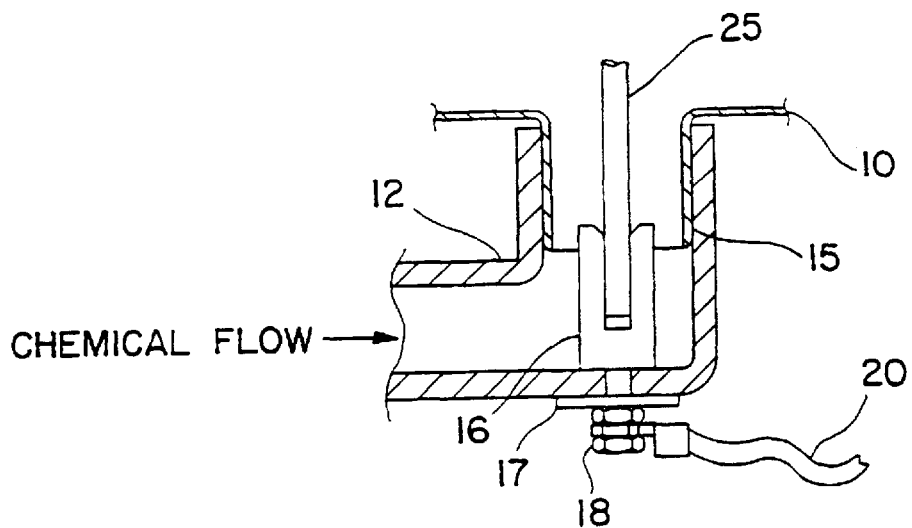
FIG. 1 is a cross-sectional view of the electrical and fluid connection in accordance with the present invention.

Turning now to FIG. 1, there is shown an anode holder for use in semiconductor manufacturing. The bowl 10 of the holder (only partially shown) is placed in an elbow 12, preferably made of a plastic, which receives fluid flow as shown by the arrow in the figure. A sealing nose 15 seats in the elbow 12 as shown. Metal (e.g, copper) female fitting 16 is secured through the elbow 12 with washer 17 and nut assembly 18. A power cable 20 in communication with a suitable power supply (not shown) is fixed to the fitting 16 and in electrical communication with metal (e.g., copper) connection 25. The nose 15 sealing connects the bowl 10 to the elbow 12 and also engages the standard electrical connection simultaneously. The connection 25 is insulated from the fluid path formed in the elbow 12. Those skilled in the art will appreciate that the elbow shape 12 is preferred, it is used for purposes of illustration; other shapes are within the scope of the present invention.

Figure 2:
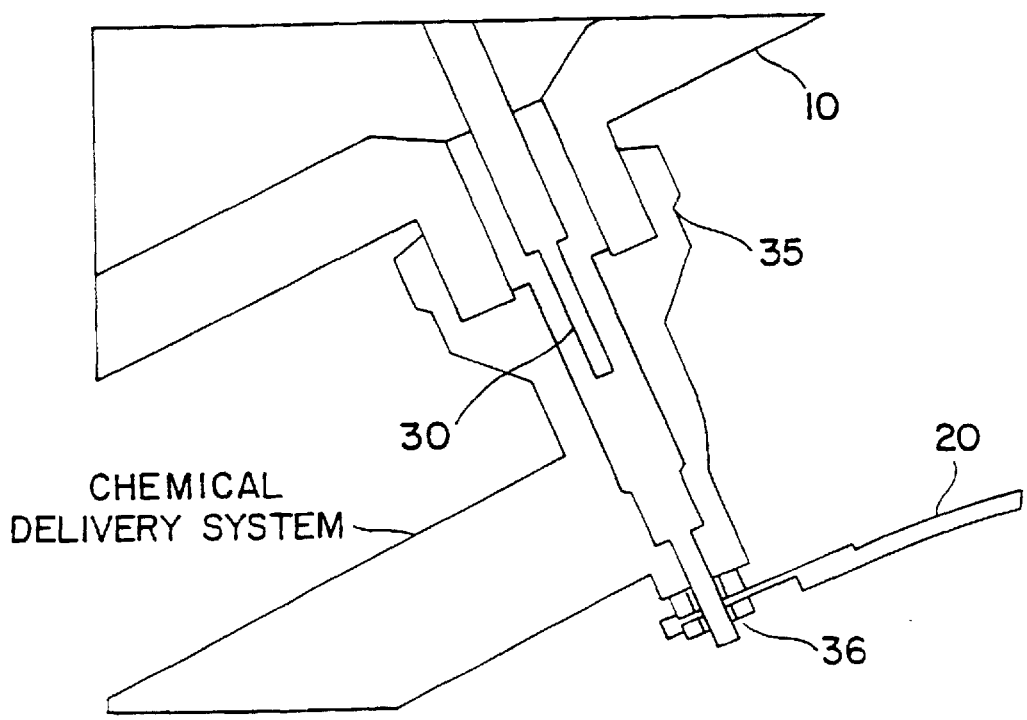
FIG. 2 is a perspective view of another embodiment of the electrical and fluid connection in accordance with the present invention.

An alternative embodiment is shown in FIG. 2. In this embodiment, a standard bayonet-type electrical connection 30 (similar to a thermocouple probe connection) is used. Nose 35 allows the bowl 10 to be interlocked into the fluid delivery system and the electrical rod to be interlocked with the electrical connect 36 (communicating with power cable 20) with a 90° twist.

Figure 3:
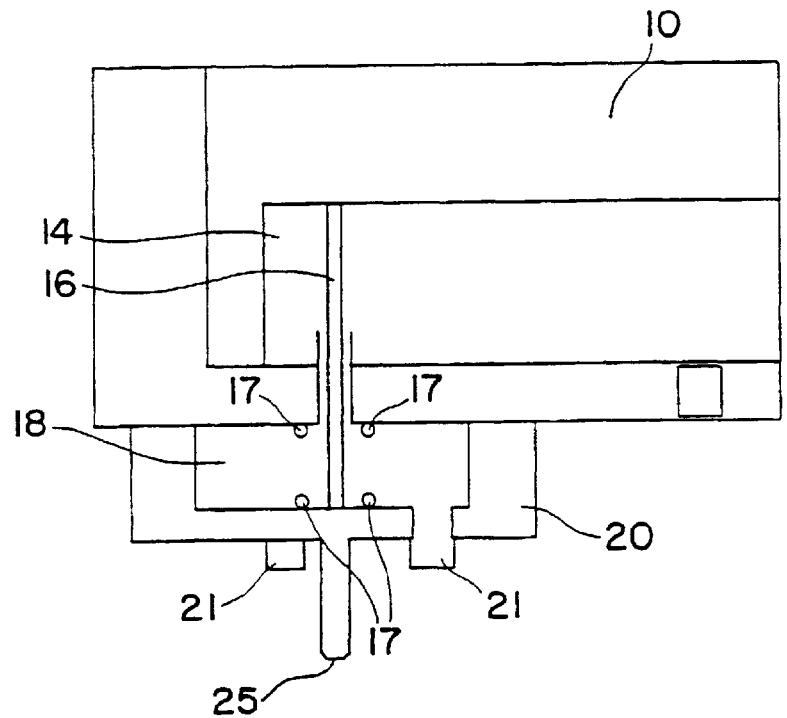
FIG. 3 is a cross-sectional view of a third embodiment of the electrical and fluid connection in accordance with the present invention.
Figure 4:
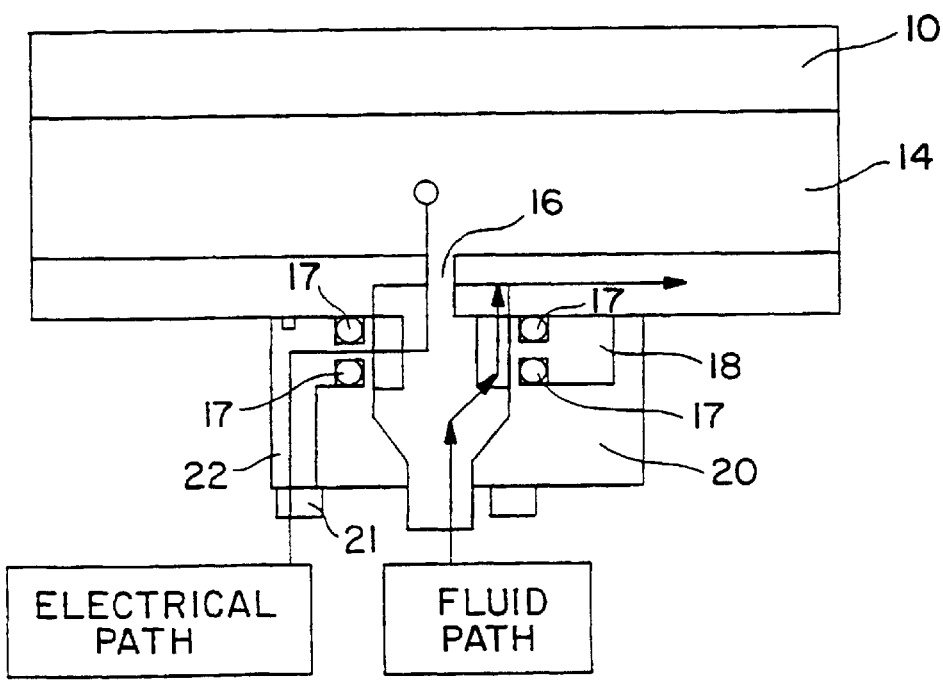
FIG. 4 is a cross-sectional view of a fourth embodiment of the electrical and fluid connection in accordance with the present invention.
Figure 5:
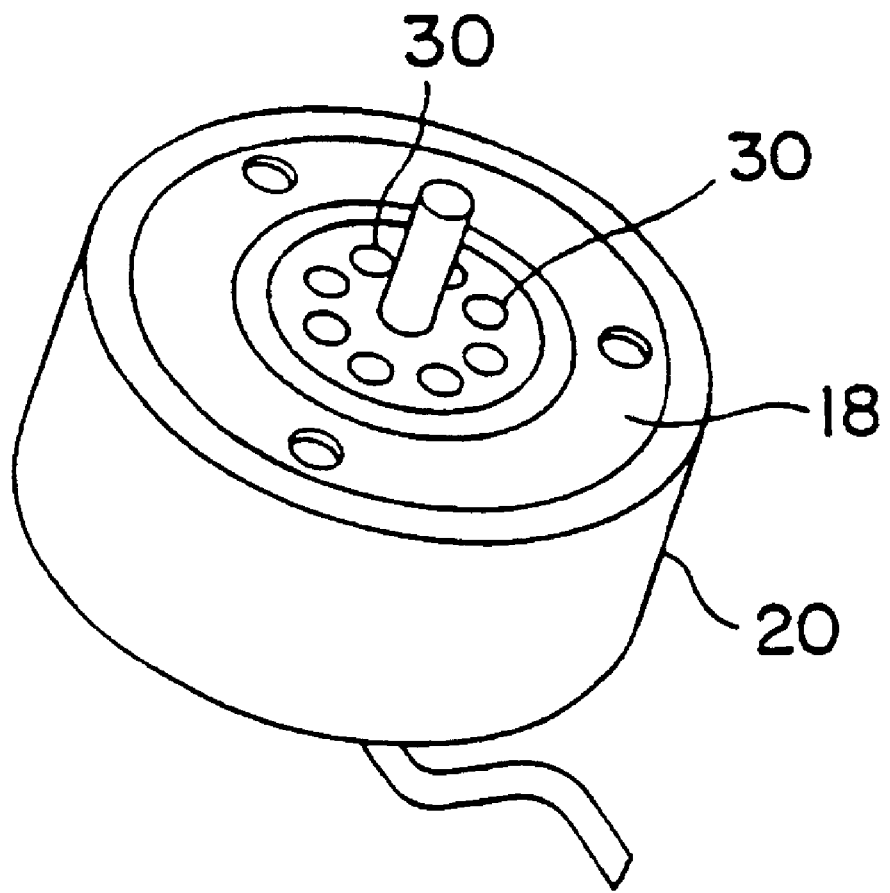
FIG. 5 is a perspective view of the embodiment of FIG. 4.

Turning now to FIGS. 3–5, there is shown embodiments of the present invention which lend themselves to pre-assembly, thereby eliminating the need to install two O-rings during assembly of the anode package into the tool. Since the connectors come from outside the housing, the anode can be installed without the connectors, thereby avoiding potential damage to the connectors that can be caused by installing a relatively heavy part with delicate features.

More specifically, FIG. 3 is a low volume flow embodiment of this feature. Anode holder bowl 10, preferably made of plastic, houses metal (preferably copper) anode 14. A housing 20, preferably also made of plastic, is secured to the bowl 10 with an electrically conductive nut 18, preferably a copper nut. It is sealed to the bowl 10 by any suitable means, such as one or more O-rings 17 as shown. The nut 18 is in electrical communication with the anode 14 via a metal rod 16, and in electrical communication with one or more external connect poles 21. A fluid connection 25 is also provided in the housing 20. This embodiment reduces four assemblies and four disposable copper parts with two assemblies and two disposable parts.

FIG. 4 illustrates a high flow embodiment of the present invention. Housing 20 secures to anode bowl 10 with copper nut 18, sealed with a plurality of O-rings 17. As best seen in FIG. 5, the nut 18 has a plurality of apertures 30 for fluid flow, the path of flow through one such aperture being shown in FIG. 4 by the arrows. Electrical communication is provided between the anode 14 and the external connection 21 by metal rod 16 and bolt 22 as shown. This embodiment replaces two disposable electrical connectors with one re-usable plastic housing and one disposable flow through nut. In addition, only two, not four, O-rings are needed for sealing.

Figure 6:
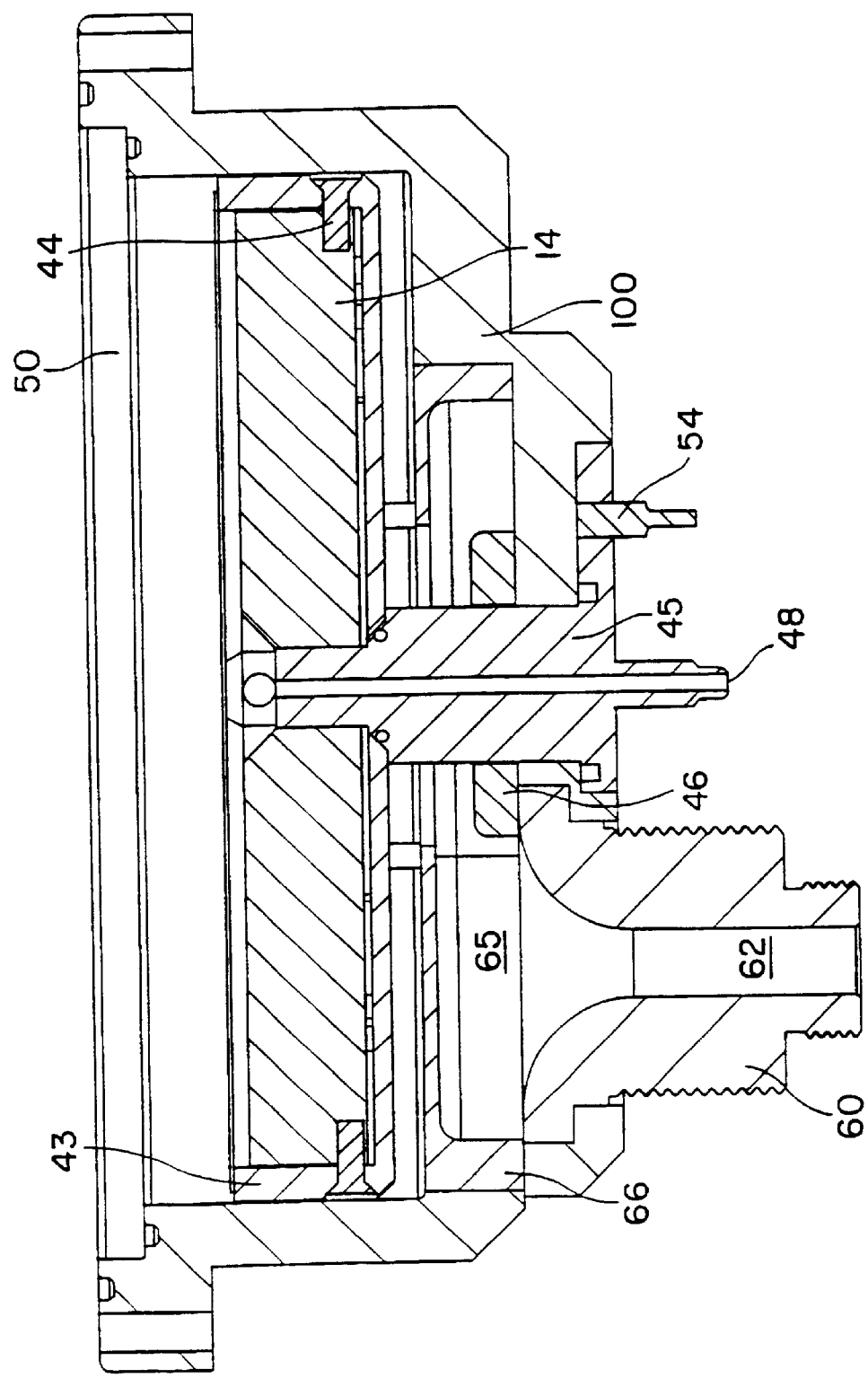
FIG. 6 is a cross-sectional view of a cell base in accordance with the present invention.

Turning now to FIG. 6, another embodiment of the present invention is illustrated. Anode 14 is secured in cell base 100 by retaining bolt 44 and support ring 43. Membrane 50 is positioned in cell base 100 downstream of the anode 14, in the direction of fluid flow. A center bolt 45 is preferably centrally located in the cell base 100 and secured with a center nut 46. The center bolt 45 includes a fluid path 48 as shown. The anode 14, anode support ring 43 and membrane 50 are all removable such as when changing the anode, but the center bolt 45 can remain in the cell base 100, thereby facilitating anode change. The bolt 45 can be secured to the anode 14 by any suitable means, such as with threads or other locking mechanisms known to those skilled in the art. The bolt 45 is electrically conductive, thereby providing electrical communication with an external power supply (not shown). An electrical pin 54, which may or may not be of the same material as the bolt 45, can be used to facilitate electrical communication between the power supply and the bolt 45.

Fitting adapter 60 is preferably offset from the center of the cell base 100, and includes external threads for connection to a main fluid supply. The fitting adapter 60 has a central bore 62 for fluid flow, which fluid feeds into passageway 65 and is deflected by flow deflector 66 for uniform and symmetrical distribution of the fluid in the cell base 100.

Although copper is disclosed above for the electrically conductive fittings, other electrically conductive materials may be used, as long as they do not cause problems (such as contamination) with the other components of the system, including the plating bath. For example, other suitable electrically conductive materials include titanium, palladium, platinum, and coated platinum.

Any of the aforementioned embodiments reduce the amount of connections necessary, thereby reducing the potential for leakage. The connectology also allows for easy disassembly for maintenance or anode replacement, reducing the number of parts needed to provide a sealed connection.

What is claimed is:

1. An anode, comprising:

a cell base housing said anode;

a fluid flow path in said cell base providing fluid communication from outside said cell base to said anode;

an electrical connector insulated from said fluid flow path and in electrical communication with said anode.

2. The anode of claim 1, wherein said anode is copper and said fluid is copper sulphate.

3. The anode of claim 1, further comprising a membrane in said cell base.

4. The anode of claim 1, wherein said electrical connector is removably secured to said anode.

5. The anode of claim 1, wherein said anode is removable from said cell base without removing said electrical connector.

* * * * *